United States Patent
Gao et al.

(10) Patent No.: US 7,518,366 B2
(45) Date of Patent: Apr. 14, 2009

(54) METHOD FOR TESTING MAGNETIC FIELD DISTRIBUTION AND APPARATUS THEREFOR

(75) Inventors: Jing Gao, Shenzhen (CN); Cheng Ni, Shenzhen (CN); Hong Yan Tao, Shenzhen (CN); Hai Bo Yu, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/900,819

(22) Filed: Sep. 13, 2007

(65) Prior Publication Data

US 2008/0068009 A1    Mar. 20, 2008

(30) Foreign Application Priority Data

Sep. 15, 2006   (CN) ........................ 2006 1 0113122

(51) Int. Cl.
*G01V 3/00* (2006.01)
(52) U.S. Cl. ...................... 324/318; 324/307
(58) Field of Classification Search ................ 324/318, 324/307
See application file for complete search history.

(56) References Cited

U.S. PATENT DOCUMENTS

| | | | | |
|---|---|---|---|---|
| 4,977,896 | A * | 12/1990 | Robinson et al. | 600/409 |
| 6,427,079 | B1* | 7/2002 | Schneider et al. | 600/424 |
| 2003/0093005 | A1* | 5/2003 | Tucker | 600/544 |
| 2003/0184297 | A1* | 10/2003 | Jakab | 324/318 |

* cited by examiner

*Primary Examiner*—Brij B. Shrivastav
*Assistant Examiner*—Megann E Vaughn

(57) ABSTRACT

The invention proposes a method and an apparatus for testing a magnetic field of a coil. The method comprises applying an alternating current to the coil to generate an alternating magnetic field; measuring simultaneously the induced electromotive potential at a plurality of positions in the alternating magnetic field; and collecting and processing signals of the induced electromotive potential so as to obtain said coil's magnetic field distribution. The apparatus comprises probes positioned in said alternating magnetic field to generate the induced electromotive potential; a multi-channel data acquisition card for collecting the signals of the potential; and a processor for processing the collected signals to obtain said coil's magnetic field distribution. The method and the apparatus eliminate the interference by the magnetic field of the earth by testing the coil's alternating magnetic field to improve test accuracy and to improve the testing efficiency by multi-channel acquisition of the test signals.

17 Claims, 3 Drawing Sheets

METHOD FOR TESTING MAGNETIC FIELD DISTRIBUTION AND APPARATUS THEREFOR

CROSS REFERENCE TO RELATED APPLICATIONS

This application claims priority of Chinese application No. 200610113122.7 filed Sep. 15, 2006, which is incorporated by reference herein in its entirety.

FIELD OF INVENTION

The present invention relates to a testing method and an apparatus therefor, and particularly to a testing method for a magnetic field distribution and an apparatus therefor.

BACKGROUND OF THE INVENTION

A coil is an important part in a magnetic resonance imaging system and before it leaves a factory or is put into use it generally needs to undergo various tests. Taking a gradient coil in a magnetic resonance imaging system as an example, besides needing to undergo routine resistance, inductance and high-voltage tests, it also needs to undergo a test for gradient magnetic field distribution.

As to a magnetic field which is close to the magnetic field strength of the earth, if a test is carried out directly, the interference will be quite significant so the accuracy will not be high. Since the magnetic field generated by a gradient coil is relatively weak and is close to the magnetic field strength of the earth, it is not feasible to supply a direct current to a gradient coil for a direct test of the magnetic field in air.

Nowadays the procedure for testing the gradient field before delivery is simply omitted by many manufacturers, and only routine resistance, inductance and high-voltage tests are performed. Obviously, this cannot ensure that the gradient coils will meet the standards; furthermore, even if a problem is found in the resistance and inductance during the routine tests, since the direct gradient field data are not available, a further analysis cannot be made to provide corresponding solutions.

In order to obtain the direct gradient field data during the research and development stage of a gradient coil, some manufacturers had a gradient coil positioned in a testable main magnetic field (for example, the main magnetic field generated by the magnet of a sub-resonance imaging system), and applied a small direct current to the gradient coil, so that it was possible to carry out tests by simply using magnetic field testing tools currently available. By subtracting the magnetic fields tested with the current on and off respectively, the situation of the magnetic field distribution generated by the gradient coil can be obtained indirectly. However, an additional magnetic field is needed in this test method (such as the testable main magnetic field mentioned above), and it is troublesome, time-consuming and laborious to install and dismantle a gradient coil in this additional magnetic field, therefore this method is only suitable for tests of limited times during the research and development stage, but not suitable for frequent tests during a manufacturing process.

Since an alternating magnetic field can be generated by applying an alternating current to a coil and then the magnetic field distribution can be obtained from the alternating magnetic field, the interference from the earth magnetic field can thereby be eliminated and the test accuracy can be improved. However, since the strength of the gradient field is close to that of the earth magnetic field, and the accuracy of tests by an ordinary detecting method and apparatus is relatively low, therefore some manufacturers have chosen to use probes of high sensitivity (such as magnetic flux gates and highly sensitive Hall probes, etc.) for carrying out gradient field tests. However, a problem brought inevitably by the highly sensitive probe is high cost, and so the choice is usually made to use only one probe, and multi-point measurements are performed by way of an accurate positioning apparatus, and usually about one hour is needed to complete a full test for a gradient coil. For this reason, such a method of using a highly sensitive probe is not only high in costs, but also low in test-efficiency and time-consuming.

Therefore, how to provide a simple, highly efficient method for testing the distribution of a magnetic field and an apparatus therefore has become a difficult problem in the manufacturing of coils.

SUMMARY OF THE INVENTION

An object of the present invention is to propose a simple and highly efficient testing method for a magnetic field distribution and an apparatus thereof, for testing the magnetic field distribution of a coil.

In order to realize the above-mentioned object, the present invention proposes a testing method for a magnetic field distribution for testing the magnetic field distribution of a coil, which method comprises the steps of: applying an alternating current to the coil to generate an alternating magnetic field; measuring simultaneously the induced electromotive potential at a plurality of positions in the alternating magnetic field; and collecting and processing signals of the induced electromotive potential so as to obtain said coil's magnetic field distribution.

Thus, multi-channel and parallel collection of said signals of the induced electromotive potential is carried out at the plurality of positions, and special processing is performed on the collected signals, such as low-noise amplification, filtration of mains frequency interference and filtration for extracting useful signals etc. so as to obtain said coil's magnetic field distribution.

Correspondingly, the present invention proposes a testing apparatus for a magnetic field distribution, for testing the magnetic field distribution of a coil, with an alternating current being supplied to said coil to generate an alternating magnetic field, comprising: a plurality of probes positioned in said alternating magnetic field for sensing said alternating magnetic field so as to generate an induced electromotive potential; a multi-channel data acquisition card connected with said plurality of probes for collecting the signals of the induced electromotive potential from said plurality of probes; and a processor connected with said multi-channel data acquisition card, for processing the collected signals of the induced electromotive potential to obtain said coil's magnetic field distribution.

The testing apparatus for a magnetic field distribution further comprises a power supply source connected with said coil for supplying to the coil an alternating current. Said probes are inductive coils wound with enameled wires. Said probes are evenly arranged along an arc or arranged in a Gaussian angular distribution on the flat plate. The flat plate is of a semicircular shape, a circular shape, or of other shapes. Said multi-channel data acquisition card comprises an analog switch for selecting the signals of the induced electromotive potential from at least one channel for subsequent processing. Said multi-channel data acquisition card further comprises an amplifier and a filter for respectively amplifying and filtering the signals of the induced electromotive potential from selected channels.

The testing method for a magnetic field distribution and the apparatus thereof according to the present invention eliminate the interference by the earth magnetic field by testing the alternating magnetic field of the coil, thereby to improve test accuracy; and at the same time, to improve test efficiency by way of multi-channel acquisition of test signals.

BRIEF DESCRIPTION OF THE DRAWINGS

The present invention is explained in more detail with the following drawings, in which.

DETAILED DESCRIPTION OF THE INVENTION

The technical solution of the testing method for a magnetic field distribution according to the present invention is to eliminate the interference from the earth magnetic field by testing the alternating magnetic field of a coil, thereby to improve the test accuracy; and at the same time to improve the test efficiency by multi-channel acquisition of the tested signals.

Figure 1:
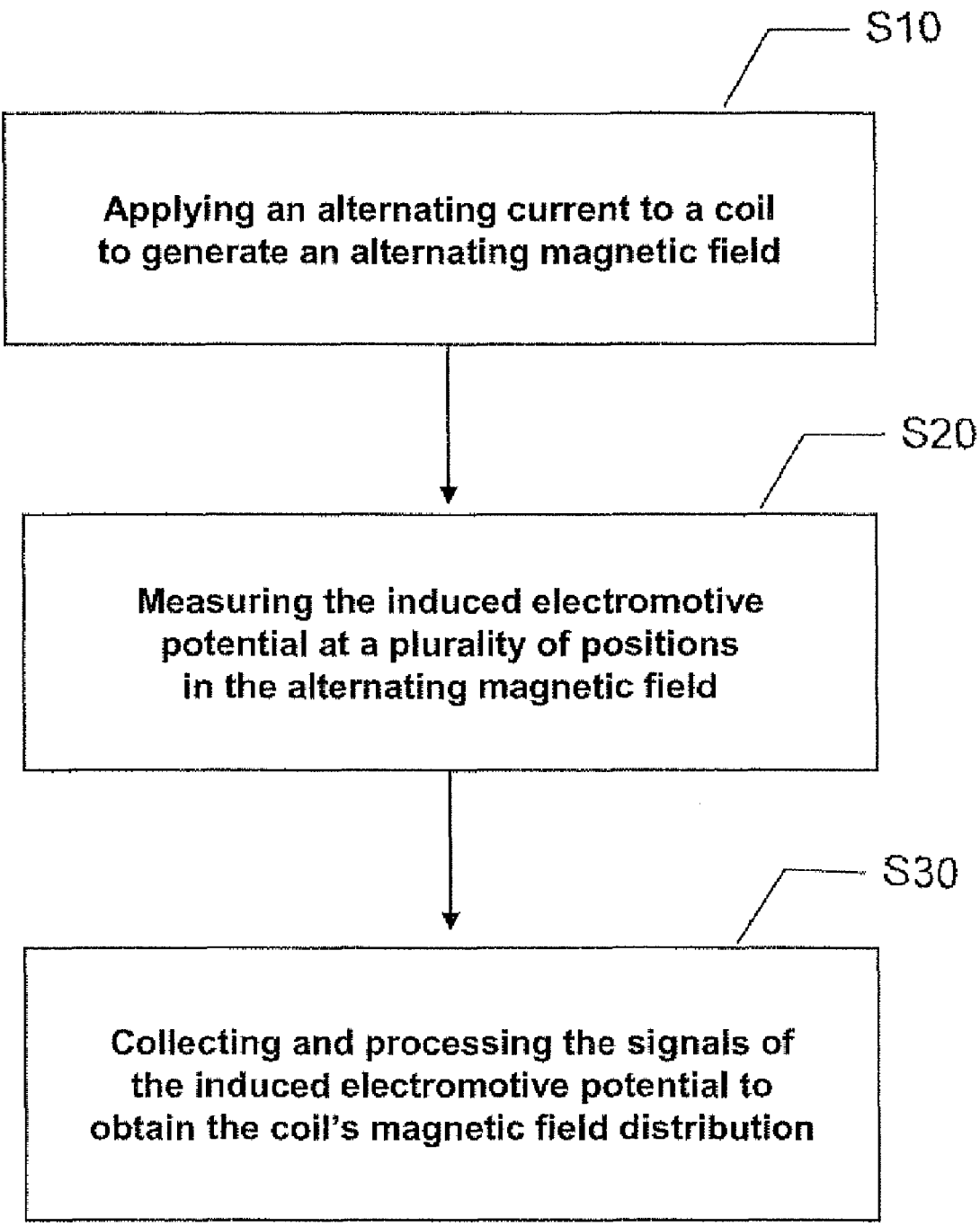
FIG. 1 is a flow chart of the testing method for a magnetic field distribution according to the present invention.

Referring to FIG. 1, the method according to the present invention comprises mainly the following steps:

Step S10: applying an alternating current to the coil to generate an alternating magnetic field. The current value of said alternating current should not be too large; for example it can be chosen as 5 Ampere, so as to prevent an increased coil heating caused by a current which is too large, which further leads to the problem of heat dissipation.

Step S20: measuring the induced electromotive potential at a plurality of positions in the alternating magnetic field. Since the probes used in the measurement will generate an induced electromotive potential in the alternating magnetic field and the strength of the induced electromotive potential varies with the changes of the strength of the alternating magnetic field, said coil's magnetic field distribution can thus be obtained by detecting the distribution of the variation of the induced electromotive potential.

Step S30: collecting and processing the signals of the induced electromotive potential to obtain said coil's magnetic field distribution. By way of the multi-channel parallel acquisition of the signals of the induced electromotive potential at said plurality of positions the test efficiency can be effectively improved and the test time can be reduced. Since the alternating current in said coil is not large, the strength of the generated alternating magnetic field is relatively small, leading to a relatively small strength of said induced electromotive potential, therefore during the subsequent processing, special treatments, such as low-noise amplification, filtration of the interference at mains frequency and filtration for extracting useful signals, are performed to the collected signals of the induced electromotive potential so as to obtain more accurate data of the magnetic field distribution.

Figure 2:
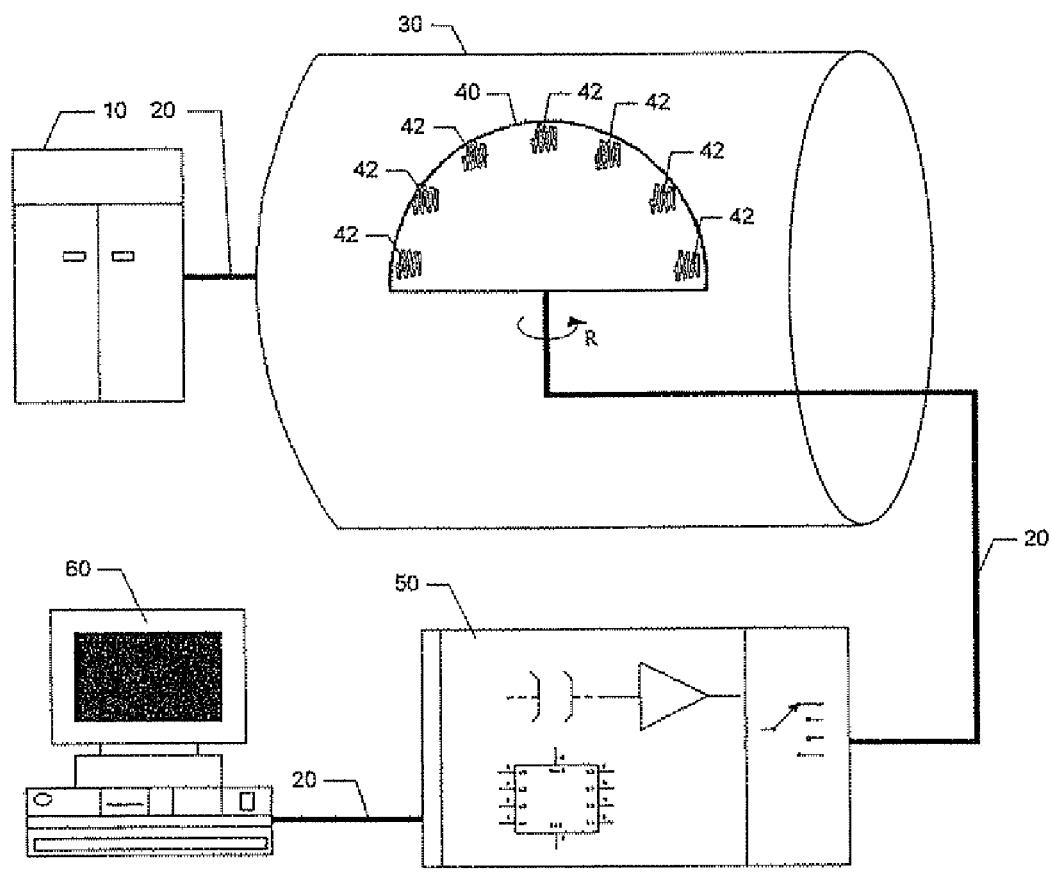
FIG. 2 is a schematic diagram of the testing apparatus for a magnetic field distribution according to the present invention.

Referring to FIG. 2, the corresponding apparatus according to the present invention comprises a power supply source 10 and a coil 30 connected in sequence by a data bus 20. The power supply source 10 supplies an alternating current to the coil 30 and the coil 30 generates an alternating magnetic field after being supplied with the alternating current. In this embodiment, the coil 30 is described, for example, as a gradient coil, and after it is supplied with the alternating current it generates an alternating magnetic field which is a gradient field. A plurality of probes 42 are arranged in the alternating magnetic field generated by the coil 30. Said probes 42 are inductive coils wound with enameled wires, each of which generates an induced electromotive potential in this alternating magnetic field.

Figure 3:
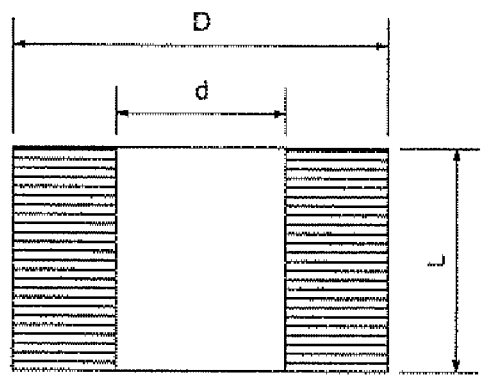
FIG. 3 is a schematic diagram of the inductive coils.

Referring to FIG. 3, provided that the inductive coils, as the above-mentioned probes, have an inner radius d, an outer radius D, a length L, a number of turns N, and when $$\frac{L}{D} = \sqrt{\frac{9(1-\lambda^5)}{20(1-\lambda^3)}}$$

is satisfied, wherein $\lambda=d/D$, the electromotive potential induced in the inductive coil is only relevant to the axial component $B_z(0,t)$ of the magnetic field starting off from its central point, and its value is $$\varepsilon = \frac{\pi D^2}{12} N(1+\lambda+\lambda^2)\frac{dB_z(0,t)}{dt}.$$

And when the coil 30 is supplied with the alternating current of a frequency ω, the alternating magnetic field generated thereby would be a simple harmonic magnetic field with its axial component being $B_z(0,t)=GI\cdot\mathrm{Sin}(\omega t+\phi)$, wherein G is the strength of the magnetic field, I is the current amplitude of said alternating current, thus leading to the induced electromotive potential generated in the coil being $$\varepsilon = -\frac{\pi D^2}{12} N(1+\lambda+\lambda^2)\cdot\omega GI\mathrm{Cos}(\omega t+\phi).$$

Therefore by collecting different induced electromotive potential values at different positions the magnetic field strength at said different positions can thus be obtained, and the magnetic field distribution of the coil 30 can further be obtained.

In this embodiment, said probes 42 are arranged on a flat plate 40, and the flat plate 40 is a semicircular one. Preferably, said probes 42 are evenly arranged along an arc on the flat plate 40, or arranged in a Gaussian angular distribution on the flat plate. By rotating the flat plate 40 in different angles along the direction illustrated by an arrow R, the induced electromotive potential at different positions can thus be detected by the probes 42 arranged thereon, so that the data of the complete magnetic field distribution can be obtained.

As a more detailed embodiment, twenty-three of said probes 42 can be arranged in a Gaussian angular distribution on a semicircular flat plate with a radius of 25 cm, when measuring the coupling state between adjacent probes under a frequency of 200K, and if the distance between said adjacent probes is 1 cm, the attenuation is up to nearly 1000 times. Therefore, when the distance between the adjacent probes is larger than 5 mm, the coupling between them is ignorable, i.e. its influence on the results by the method according to the present invention can be ignored.

Although in this embodiment the flat plate 40 is a semicircular one, in other embodiments it can also be a circular one or one of another shape. Similarly, the distribution of said probes 42 on the flat plate 40 is not confined to being evenly distributed along an arc or in the Gaussian angular distribution; other forms of distribution with determined and regular positions can likewise be used in the present invention.

The apparatus according to the present invention further comprises a multi-channel data acquisition card 50 connected with said plurality of probes 42 via a data bus 20, for collecting the signals of the induced electromotive potential from said plurality of probes 42. The multi-channel data acquisition card 50 is further connected via the data bus 20 to a computer 60 comprising a processor, and by the processor it processes the collected signals of the induced electromotive potential to obtain the coil's magnetic field distribution. Said processing to the signals of the induced electromotive potential includes, but is not confined to, calculating a slew rate (the ascending speed of a gradient field during a unit time period, slew rate=strength of gradient/slewing time) etc.

Figure 4:
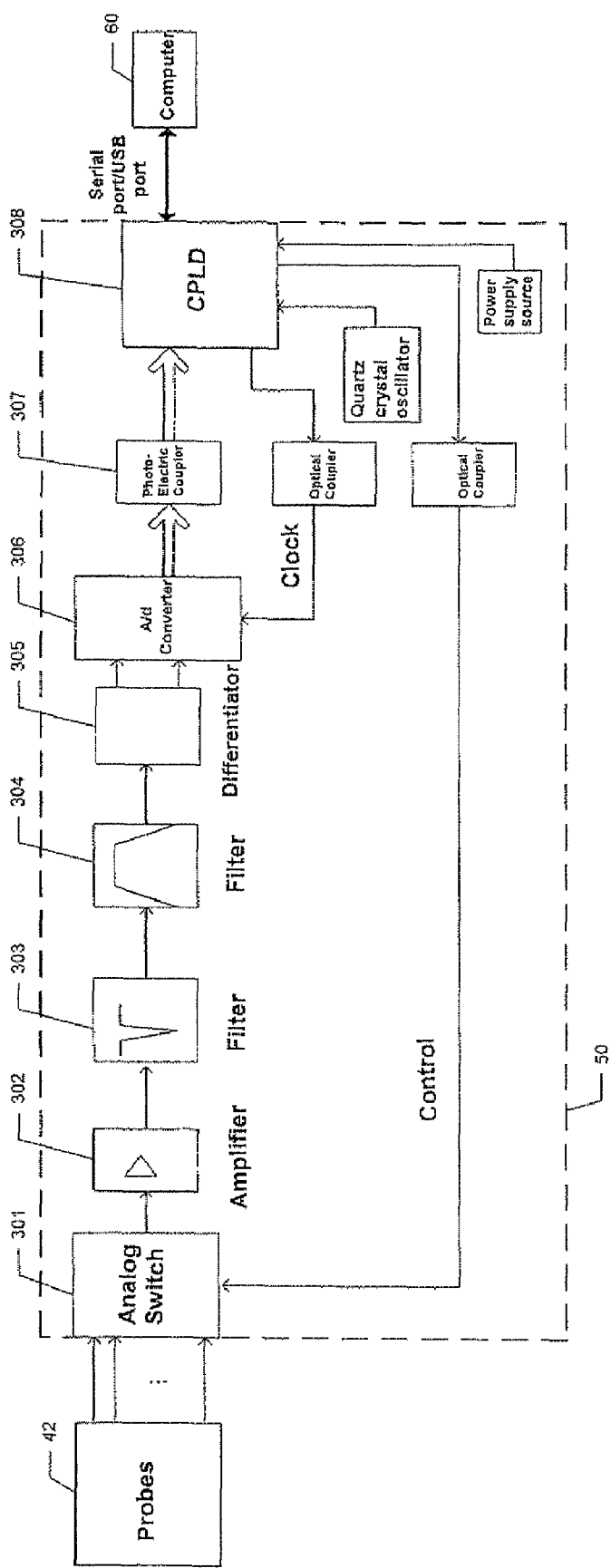
FIG. 4 is an illustration of the working principles of the multi-channel data acquisition card in FIG. 2.

Referring to FIG. 4, said multi-channel data acquisition card 50 is connected with said plurality of probes 42 via a plurality of corresponding channels to perform the signal acquisition. The multi-channel acquisition card 50 comprises an analog switch 301 for selecting the signals of the induced electromotive potential collected from at least one channel for subsequent processing. The multi-channel acquisition card 50 further comprises an amplifier 302 for performing low-noise amplification to the signals of the induced electromotive potential from a selected channel; filters 303, 304 for filtering the amplified signals, and said filtering comprises, but is not confined to, the filtering of interference at the mains frequency, the extracting of useful signals, etc. The above-mentioned amplified and filtered signals pass through a differentiator 305 and an analog/digital converter 306 in said multi-channel acquisition card 50, and then they are connected into a CPLD (complicated Programmable Logic Device) 308 via a photoelectric coupler 307a, and finally they are connected to said computer 60 via a serial port (RS232) or a USB port. The computer 60 can transmit instructions to the multi-channel acquisition card 50 via the serial port (RS232) or the USB port so as to realize the control of sampling time and sampling frequency on a certain channel.

The invention claimed is:

1. A method for testing a magnetic field distribution of a coil, comprising:
    applying an alternating current to the coil for generating an alternating magnetic field;
    arranging a plurality of probes positioned at a plurality of positions in the alternating magnetic field;
    generating an induced electromotive potential by the probes;
    simultaneously measuring the induced electromotive potential at the plurality of positions in the alternating magnetic field;
    collecting signals of the induced electromotive potential at the plurality of positions; and
    processing the collected signals for obtaining the magnetic field distribution of the coil,
    wherein the probes are arranged on a flat plate.

2. The method as claimed in claim 1, wherein the alternating magnetic field is a gradient field.

3. The method as claimed in claim 1, wherein the signals are multi-channel collected in parallel at the plurality of positions.

4. The method as claimed in claim 1, wherein a low-noise amplification is performed on the signals.

5. The method as claimed in claim 1, wherein the signals are filtered to eliminate an interference at a mains frequency.

6. The method as claimed in claim 1, wherein the signals are filtered to extract useful signals.

7. An apparatus for testing a magnetic field distribution of a coil, comprising:
    a plurality of probes positioned at a plurality of positions in an alternating magnetic field generated by an alternating current being applied to the coil, the probes being configured to generate an induced electromotive potential at the plurality of positions;
    a multi-channel data acquisition card connected with the probes that collects signals of the induced electromotive potential from the plurality of probes; and
    a processor connected with the multi-channel data acquisition card that processes the collected signals to obtain the magnetic field distribution of the coil,
    wherein the probes are arranged on a flat plate.

8. The apparatus as claimed in claim 7, further comprising a power supply source connected with the coil for supplying the alternating current to the coil.

9. The apparatus as claimed in claim 7, wherein the coil is a gradient coil.

10. The apparatus as claimed in claim 7, wherein the probes are inductive coils wound by enameled wires.

11. The apparatus as claimed in claim 7, wherein the flat plate is a semicircular flat plate.

12. The apparatus as claimed in claim 7, wherein the flat plate is a circular flat plate.

13. The apparatus as claimed in claim 7, wherein the probes are evenly arranged along an arc on the flat plate.

14. The apparatus as claimed in claim 7, wherein the probes are arranged on the flat plane in a Gaussian angular distribution.

15. The apparatus as claimed in claim 7, wherein the multi-channel data acquisition card comprises an analog switch for selecting at least one of the signals from at least one channel for subsequently processing.

16. The apparatus as claimed in claim 15, wherein the multi-channel data acquisition card comprises an amplifier for amplifying the selected signal.

17. The apparatus as claimed in claim 16, wherein the multi-channel data acquisition card comprises a filter for filtering the amplified signal.

* * * * *